(12) United States Patent
Schneider

(10) Patent No.: US 11,726,156 B2
(45) Date of Patent: Aug. 15, 2023

(54) MAGNETIC RESONANCE TOMOGRAPHY WITH SIMULATION-BASED INTERFERENCE REDUCTION

(71) Applicant: Siemens Healthcare GmbH, Erlangen (DE)

(72) Inventor: Rainer Schneider, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 58 days.

(21) Appl. No.: 17/538,321

(22) Filed: Nov. 30, 2021

(65) Prior Publication Data

US 2022/0187397 A1 Jun. 16, 2022

(30) Foreign Application Priority Data

Dec. 11, 2020 (EP) ..................................... 20213418

(51) Int. Cl.
*G01R 33/421* (2006.01)
*G01R 33/54* (2006.01)

(52) U.S. Cl.
CPC ......... *G01R 33/421* (2013.01); *G01R 33/543* (2013.01)

(58) Field of Classification Search
CPC ............... G01R 33/421; G01R 33/543; G01R 33/5659; G01R 33/5608
See application file for complete search history.

(56) References Cited

U.S. PATENT DOCUMENTS

2015/0077109 A1* 3/2015 Grodzki ............... G01R 33/543
324/309
2017/0108569 A1 4/2017 Harvey
(Continued)

FOREIGN PATENT DOCUMENTS

EP 3467531 A1 4/2019
WO 2019068687 A2 4/2019

OTHER PUBLICATIONS

Cao, Zhipeng, et al. "Bloch-based MRI system simulator considering realistic electromagnetic fields for calculation of signal, noise, and specific absorption rate." Magnetic resonance in medicine 72.1 (2014): 237-247.

(Continued)

*Primary Examiner* — G. M. A Hyder
(74) *Attorney, Agent, or Firm* — Lempia Summerfield Katz LLC

(57) ABSTRACT

An MR sequence for an object is simulated by a computing unit in order to determine a simulation signal relating to a course of a transverse magnetization of nuclear spins. Depending on the simulation signal, a resting period of the MR sequence is determined during which an expected MR signal amplitude is always less than or equal to a predetermined limit value. An MR recording is carried out in accordance with the MR sequence, wherein an analysis signal is received in each case by a main receiving antenna and at least one auxiliary receiving antenna during an analysis period corresponding to the resting period and at least one interference suppression parameter is determined in dependence on the analysis signals. An MR signal is received by the main receiving antenna and an interference signal is received in each case by the at least one auxiliary receiving antenna. An interference-suppressed MR signal is generated based on the MR signal, the interference signals and the at least one interference suppression parameter.

20 Claims, 2 Drawing Sheets

(56) References Cited

U.S. PATENT DOCUMENTS

2018/0224512 A1  8/2018  Poole et al.
2020/0249292 A1  8/2020  Biber

OTHER PUBLICATIONS

European Search Report for European Application No. 20213418.5-1126 dated May 21, 2021.
Xanthis, Christos G., et al. "MRISIMUL: a GPU-based parallel approach to MRI simulations." IEEE transactions on medical imaging 33.3 (Mar. 2014): 607-617.

* cited by examiner

MAGNETIC RESONANCE TOMOGRAPHY WITH SIMULATION-BASED INTERFERENCE REDUCTION

RELATED CASE

This application claims the benefit of European Application EP 20213418.5, filed on Dec. 11, 2020, which is hereby incorporated by reference in its entirety.

BACKGROUND

The present embodiments relate to a method for operating a magnetic resonance tomography system, a magnetic resonance tomography system, and a computer product.

Magnetic resonance tomography systems, MRT (also MRI), are imaging apparatuses which, for imaging an examination object, align nuclear spins of the examination object with a strong external magnetic field and, by an alternating magnetic field, excite them to precession about the corresponding alignment. The precession, or return, of the spins from this excited state to a state with less energy in turn generates, in response, a magnetic alternating field, which is detected by receiving antennas.

Magnetic gradient fields can be used to impress spatial encoding onto the signals that then permits an assignment of the received signal to a volume element of the examination object. The received signal can then be evaluated, for example, in order to provide a three-dimensional imaging representation of the examination object. The receiving antennas used can, for example, be local receiving antennas, so-called local coils that, to achieve a better signal-noise ratio, SNR, can be arranged directly on the examination object. However, the receiving antennas can also be arranged in the environment of the examination object or, for example, be installed in a patient couch.

The magnetic resonance (MR) signals to be received for imaging are extremely weak so that, in known MRT systems, it is necessary to shield external interference signals in order to achieve a sufficient SNR. For this purpose, particularly complex shielding booths are installed in order to reduce the interfering emissions. This results in considerable costs and structural restrictions due to the corresponding space requirements.

WO 2019/068687 A2 describes a magnetic resonance tomography device with active interference suppression and a corresponding method. Herein, a first receiving antenna is provided for receiving a magnetic resonance signal from a patient and a second receiving antenna is provided for receiving an interference signal. A receiver connected to the receiving antennas is designed to suppress the interference signal received by the second receiving antenna in the magnetic resonance signal received by the first receiving antenna. For this purpose, the interference signal is determined during the MRT sequence for signal acquisition, wherein time periods can be used in which no MR signal for imaging is expected. An interference suppression control unit can then combine the signals from the first receiving antenna and the second receiving antenna in a weighted manner in order to minimize the energy of the interference signal in the combined signal.

Since, depending on the MRT sequence used, these periods are of different lengths and occur at different times, the interference suppression procedure has to be adapted individually to each MRT sequence, which leads to increased overheads. In addition, the underlying physical systems are very complex so that the prediction of suitable periods is difficult and thus unreliable.

SUMMARY

Against this background, it is an object of the present embodiments to disclose an improved concept for an MRT system or for a method for operating such a system by which the overheads required for shielding external interference signals can be reduced and, at the same time, highly effective interference reduction is possible, in particular with the lowest possible adaptation overheads.

This object is achieved in the present case by the respective subject matter of the independent claims. Advantageous developments and preferred embodiments are the subject matter of the dependent claims.

The improved concept is based on the idea of simulating the temporal and spatial course of the transverse magnetization of an ensemble of nuclear spins of an object to be examined during a MR sequence and determining a resting period of the MR sequence based thereon. Interference suppression parameters for suppressing external interfering influences are determined based on signals received during an analysis period of a subsequent MR recording corresponding to the resting period.

The improved concept discloses a method for operating an MRT system, wherein the MRT system has a main receiving antenna and at least one auxiliary receiving antenna arranged outside an examination region of the MRT system. A simulation of a predetermined MR sequence for an object is carried out by a computing unit (computer or processor), for example of the MRT system, in order to determine at least one simulation signal relating to a temporal and spatial course of the transverse magnetization of an ensemble of nuclear spins of the object. The computing unit determines a resting period of the MR sequence in dependence on the at least one simulation signal, wherein, during the resting period, an absolute value of an expected MR signal amplitude is always less than or equal to a predetermined limit value. The MRT system carries out an MR recording of the object in accordance with the MR sequence, wherein during an analysis period corresponding to the resting period, in particular of the MR sequence or the MR recording, an analysis signal is received in each case by the main receiving antenna and the at least one auxiliary receiving antenna. Depending on the analysis signals of the main receiving antenna and the at least one auxiliary receiving antenna, at least one interference suppression parameter is determined, for example by an interference suppression facility (computer or processor) of the MRT system. The main receiving antenna receives an MR signal during MR recording outside the analysis period and the at least one auxiliary receiving antenna in each case receives an interference signal outside the analysis period during the MR recording. An interference-suppressed MR signal is generated, in particular by the interference suppression facility, based on the MR signal, the interference signals and the at least one interference suppression parameter.

Depending on the interference-suppressed magnetic resonance, MR, signal, a position space image can be generated, for example, that in particular represents the object, for example by the computing unit.

The examination region of the MRT system can, for example, be located within a patient tunnel of the MRT system. The at least one auxiliary receiving antenna is then, for example, arranged outside the patient tunnel or in the vicinity of an opening in the patient tunnel. Herein, an opening in the patient tunnel can in particular be considered to be an opening through which a patient couch with a patient can be moved into the patient tunnel or out of the patient tunnel. If the at least one auxiliary receiving antenna is arranged in the vicinity of an opening, this can, for example, correspond to a distance of less than 0.1 m, less than 0.2 m, less than 0.5 m, less than 1 m or less than 2 m. In the vicinity of the opening can also correspond to a distance from the opening that is less than quarter of a wavelength of a radio wave in air with a Larmor frequency of the MRT system or less than half the wavelength.

In general, in particular outside the analysis period, the main receiving antenna preferably receives the MR signal, but in the presence of interference sources, this usually also includes a small component of the interference signal. Conversely, the at least one auxiliary receiving antenna usually receives not only the interference signal, but also a small component of the MR signal. Nevertheless, for the sake of simplicity, in the following, the signal received by the main receiving antenna outside the analysis period will be referred to as the MR signal and the signal received by the at least one auxiliary receiving antenna will be referred to as the interference signal.

The interference suppression parameters can, for example, contain weighting factors for the main receiving antenna and the at least one auxiliary receiving antenna. According to the weighting factors, it is then possible for a combination of the MR signal with the interference signals to be generated as an interference-suppressed MR signal. The combination can correspond to a linear combination, but non-linear combinations are also conceivable. In other words, the weighting factors are used for the weighted summation of signals corresponding to or depending on the respective output signals of the main receiving antenna and the at least one auxiliary receiving antenna. The weighting factors can therefore, for example, be used for the weighted summation of the MR signal with the interference signals. For example, the interference suppression facility can include a summation facility that can form a combination dependent upon the respective weighting factors, for example a linear combination, from the output signals of the auxiliary receiving antennas and the main receiving antenna.

Herein, the weighting factors can be determined in such a way that the influence of one or more external interference sources can be at least partially suppressed, i.e., that the combination of the MR signal with the interference signals or, in other words, an interference-suppressed MR signal, is influenced as little as possible by the one or more interference sources.

For this purpose, the interference suppression facility can, for example, vary the first weighting factors such that the influence of the one or more interference sources in the resulting combination of the analysis signals is as low as possible, i.e., it is minimized. Since, according to the simulation, no MR signal is to be expected during the analysis period, particularly reliable compensation of the interfering influences can be achieved here. The interference suppression facility can, for example, vary the weighting factors in order to minimize the energy of the resulting combination overall. The weighting factors can in particular also be complex in order to take a phase shift into account. The weighting factors obtained on the basis of the optimization of the combination of the analysis signals can be used to combine the MR signal with the interference signals at a later time.

Therefore, the improved concept uses the simulation of the MR sequence to determine optimal time periods for the determination of the interference suppression parameters during the specific MR sequence in advance. This enables the conditions for determining the interference suppression parameters to be optimized thus enabling particularly reliable compensation of interfering influences.

Finally, the improved concept also enables the use of shielding booths for shielding against external interfering influences to be dispensed with; or the shielding booths can have a simpler design, thus saving installation space and/or costs.

The combination of the MR signal with the interference signals can be designed as a linear combination, i.e., a combination that is linear. However, non-linear combinations are also conceivable, depending on the weighting factors.

The at least one auxiliary antenna can in particular include two or more auxiliary antennas. Accordingly, in embodiments of this kind, the interference suppression apparatus can weight such interference signals with a particularly large amplitude in relation to weaker ones since stronger interference signals can be suppressed particularly well by a particularly large distance between the signal level and the statistical background noise.

The computing unit can include the interference suppression facility or be embodied separately therefrom. In the latter case, the interference suppression facility can itself include a further computing unit (computer or processor). The interference suppression facility, in particular the further computing unit, can, for example, include a programmable logic unit, for example a field-programmable gate array, FPGA, or a digital signal processor, DSP. The interference-suppressed magnetic resonance signal can then be generated in real time, for example.

However, it is also possible for the interference suppression apparatus to include a memory that initially stores the interference signals and the MR signal. The interference-suppressed MR signal is then, for example, only generated at a later time with a delay of, for example, a duration of an echo sequence, an excitation sequence or an entire image acquisition of a single slice or the entire image acquisition sequence. The delay can, for example, be greater than 50 ms, greater than 100 ms, greater than 0.5 s, greater than 1 s, greater than 10 s, greater than 1 min or even greater.

Alternatively, the tasks and functions of the further computing unit can also be taken over by the computing unit.

The MRT system can include a receiver for receiving the interference signals and the magnetic resonance signal. The receiver can, for example, be part of the interference suppression facility or vice versa. Herein, the receiver can in particular include hardware for analog and/or digital radio-frequency processing, such as, for example, one or more amplifiers, mixers or filters and/or an image evaluation unit for the later generation of the position space image or other images from the interference-suppressed magnetic resonance signal.

In order to carry out the simulation of the MR sequence of the object, it is, for example, possible for a model to be specified, for example stored on a memory unit of the computing unit, which defines and mathematically describes the ensemble of nuclear spins or the corresponding required properties and parameters. For each nuclear spin of the ensemble, for example, a Bloch equation can be numerically solved, and at least approximately, in order to determine the at least one simulation signal. In this way, it is possible to determine the corresponding expected contribution to the transverse magnetization of the entire nuclear spin ensemble.

Herein, the Bloch equations can be solved spatially and temporally in particular in accordance with the course of the MR sequence, which is characterized in particular by one or more excitation pulses, one or more gradient pulses, one or more readout periods and so on. Herein, only a qualitative course of the transverse magnetization is required to determine the resting period. This enables the simulation overheads to be limited accordingly.

Thus, the at least one simulation signal can in particular include a signal representing the qualitative course, in particular a qualitative temporal and spatial course, of the transverse magnetization.

According to at least one embodiment of the method according to the improved concept, the simulation of the MR sequence is carried out in dependence on at least one characteristic property of the main receiving antenna and/or in dependence on at least one characteristic property of the at least one auxiliary receiving antenna.

Herein, the at least one characteristic property of the main receiving antenna or the at least one auxiliary receiving antenna can in particular include a sensitivity profile of the main receiving antenna or the at least one auxiliary receiving antenna.

Herein, the sensitivity profiles can, for example, correspond to a spatial depth of penetration into the object.

Antennas that receive a smaller signal component during the measurement, for example because the antenna is correspondingly further away from the object, can receive a smaller component of the MR signal, but, for example, a stronger corresponding interference signal. The local weighting of the main receiving antenna and/or the at least one auxiliary receiving antenna or a corresponding selection of individual coil elements of the auxiliary receiving antennas or the main receiving antenna enables the interference suppression parameters, and in particular the weighting factors, to be determined more precisely.

According to at least one embodiment, the at least one simulation signal includes a simulated MR signal and the at least one interference suppression parameter is determined in dependence on the analysis signals and the simulated MR signal.

Therefore, in contrast to the qualitative course of the transverse magnetization, an attempt is made to predict the MR signal actually received by the main receiving antenna as precisely as possible, wherein it is hypothetically assumed that no external interfering influences would be present. In other words, the interference-suppressed MR signal or MR signal without interference can be approximately predicted.

Taking account of the simulated MR signal enables the risk of signal components that are actually correct being incorrectly removed during the combination of the MR signal received by the main receiving antenna and the interference signals received by the at least one auxiliary receiving antenna to be reduced. For example, interference signals that correlate more strongly with the simulated MR signal can be weighted less heavily in order to achieve this. This enables interference suppression or the reconstruction of the actual MR signal to be performed with even greater accuracy.

According to at least one embodiment, the computing unit determines a further resting period of the MR sequence occurring after the resting period in dependence on the at least one simulation signal, wherein, during the further resting period, the absolute value of the expected MR signal amplitude is always less than or equal to the predetermined limit value. During a further analysis period of the MR sequence corresponding to the further resting period, a further analysis signal is received in each case by the main receiving antenna and the at least one auxiliary receiving antenna. The at least one interference suppression parameter is updated in dependence on the further analysis signals, in particular by the interference suppression facility. A further MR signal is received by the main receiving antenna during MR recording outside the analysis period and outside the further analysis period, and a further interference signal is received in each case by the at least one auxiliary receiving antenna. A further MR signal that has been interference suppressed is generated, in particular by the interference suppression facility, based on the further MR signal, the further interference signals and the at least one updated interference suppression parameter.

The determination of a plurality of resting periods and the repeated determination or updating of the interference suppression parameters, on the one hand, enables these to be determined with increasing precision and, on the other hand, also allows time-variable interfering influences or interference sources to be taken into account.

According to at least one embodiment, the MR signal and the interference signals are combined in dependence on the at least one interference suppression parameter in order to generate the interference-suppressed MR signal and/or the further MR signal, and the further interference signals are combined in dependence on the at least one updated interference suppression parameter in order to generate the further MR signal that has been interference suppressed.

According to at least one embodiment, the at least one interference suppression parameter contains a weighting factor for a function of the MR signal. The at least one interference suppression parameter in each case contains a weighting factor for a function of the respective interference signal for each of the interference signals. The interference-suppressed MR signal is generated as the sum of the function of the MR signal and the respective functions of the interference signals weighted based on the weighting factors.

According to at least one embodiment, the at least one interference suppression parameter in each case contains a weighting factor for the MR signal and for each of the interference signals. The interference-suppressed MR signal is generated as the sum of the MR signal and the interference signals weighted based on the weighting factors.

In other words, in such embodiments, the functions are all the same as the identity function so that a linear combination is achieved.

According to at least one embodiment, an optimization method is carried out, in particular by the interference suppression facility, in which the weighting factors are varied in order to determine the at least one interference suppression parameter.

The optimization method can, for example, include a linear optimization method or a method according to the least-squares method or another variation of a method.

The optimization method enables, for example, the minimization of the energy of the sum of the analysis signals or functions of the analysis signals weighted according to the weighting factors.

The improved concept also discloses an MRT system including a main receiving antenna, at least one auxiliary receiving antenna arranged outside an examination region, a control unit (controller) and a computing unit (computer or processor). The computing unit is configured to carry out a simulation of a predetermined MR sequence of an object in order to determine at least one simulation signal relating to a temporal and spatial course of the transverse magnetization of an ensemble of nuclear spins of the object. The computing unit is configured to determine a resting period of the MR sequence in dependence on the at least one simulation signal, wherein, during the resting period, an absolute value of an expected MR signal amplitude is always less than or equal to a predetermined limit value. The control unit is configured to actuate the MRT system in order to carry out an MR recording of the object in accordance with the MR sequence, wherein during an analysis period corresponding to the resting period, in each case an analysis signal is received by the main receiving antenna and the at least one auxiliary receiving antenna. The control unit is configured to determine at least one interference suppression parameter in dependence on the analysis signals and to generate an interference-suppressed MR signal based on an MR signal and interference signals and the at least one interference suppression parameter. Herein, during MR recording outside the analysis period, the MR signal is received by the main receiving antenna and one of the interference signals is in each case received by the at least one auxiliary receiving antenna.

Herein, the control unit can in particular include the interference suppression facility described with respect to the method according to the improved concept.

Further embodiments of the MRT system according to the improved concept follow directly from the different embodiments of the method according to the improved concept and vice versa. An MRT system according to the improved concept is in particular configured to carry out a method according to the improved concept or carries out such a method.

The improved concept also discloses a computer program with instructions. When the computer program or instructions are executed by an MRT system according to the improved concept, the instructions cause the MRT system to execute a method according to the improved concept.

The improved concept also discloses a non-transitory computer-readable storage medium that stores a computer program according to the improved concept.

The computer program and the computer-readable storage medium can be understood as computer program products with the instructions.

The features and feature combinations mentioned above in the description and the features and feature combinations mentioned below in the description of the figures and/or shown in the figures alone are usable not only in the respectively disclosed combination but also in other combinations without departing from the scope of the invention. Embodiments and feature combinations that do not have all the features of an originally formulated independent claim or extend beyond or deviate from the feature combinations in the back-references in the claims should also be considered to be disclosed.

BRIEF DESCRIPTION OF THE DRAWINGS

The figures show.

DETAILED DESCRIPTION OF THE PREFERRED EMBODIMENTS

Figure 1:
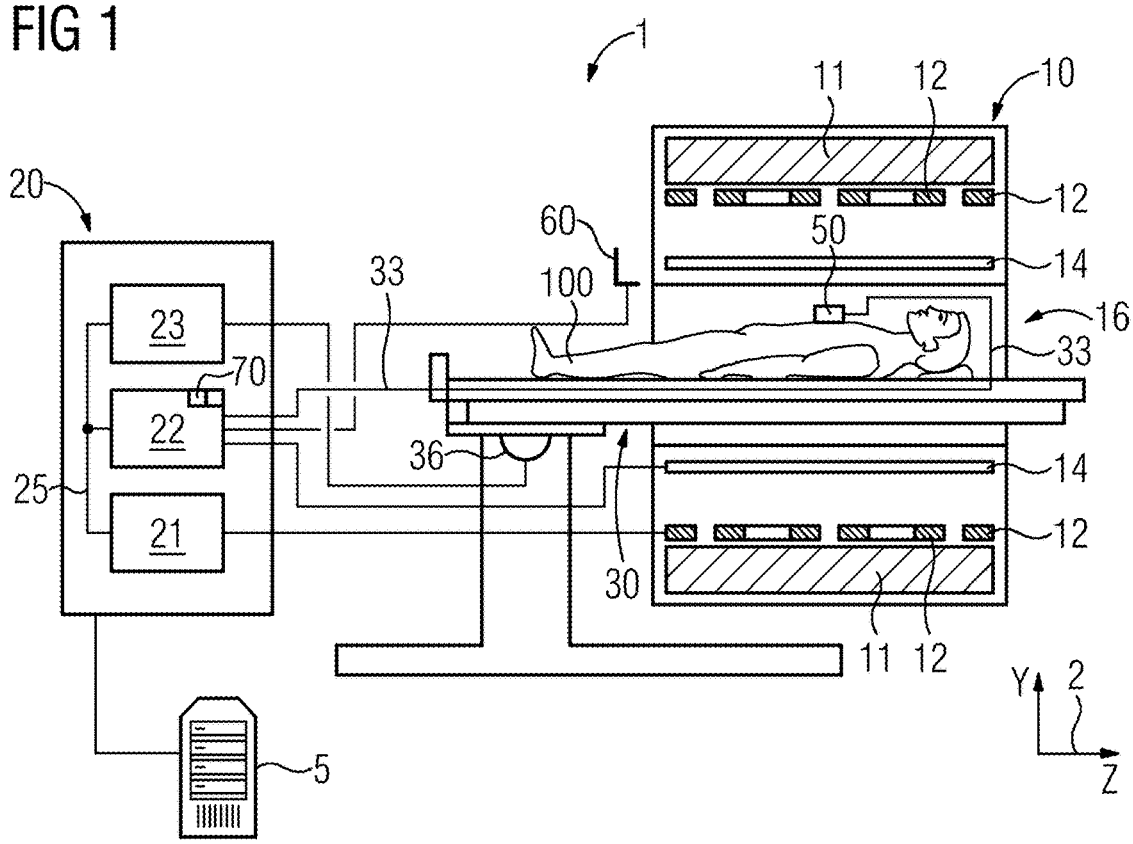
FIG. 1: a schematic representation of an exemplary embodiment of an MRT system according to the improved concept.

FIG. 1 shows a schematic representation of an exemplary embodiment of an MRT system 1 according to the improved concept.

The MRT system 1 has a magnet unit 10 with a field magnet 11 that generates a static magnetic field for aligning nuclear spins of a sample, for example a patient 100, in an examination region or recording region. The recording region is characterized by an extremely homogeneous static magnetic field, wherein the homogeneity relates in particular to the magnetic field strength or its magnitude. The recording region is, for example, almost spherical and is positioned in a patient tunnel 16, which extends in a longitudinal direction 2 through the magnet unit 10. The field magnet 11 can, for example, be a superconducting magnet capable of providing magnetic fields with a magnetic flux density of up to 3 T or more. However, for lower field strengths, it is possible to use permanent magnets or electromagnets with normally conducting coils. A patient couch 30 can be moved in the patient tunnel 16 by a drive unit 36.

Furthermore, the magnet unit 10 has gradient coils 12 designed to superimpose location-dependent magnetic fields on the static magnetic field in the three spatial directions in order to spatially differentiate the acquired imaging regions in the recording region. The gradient coils 12 can, for example, be coils made of normally conducting wires, which can, for example, generate mutually orthogonal fields or field gradients in the recording region.

The magnet unit 10 can, for example, include as a transmitting antenna a body coil 14 designed to irradiate a radio-frequency signal supplied via a signal line into the examination region. In some embodiments, the body coil 14 can also be used to receive resonance signals emitted by the patient 100 and output them via a signal line. Therefore, in such embodiments, the body coil 14 can be used as a main receiving antenna as well as a transmitting antenna.

The MRT system 1 has a control unit 20 which can supply the magnet unit 10 with different signals for the gradient coils 12 and the body coil 14 and evaluate the received signals. The control unit 20 can, for example, include a gradient controller 21 designed to supply, via supply lines, the gradient coils 12 with variable currents, which, when their timing is coordinated, can provide the desired gradient fields in the examination region.

The control unit 20 can also include a radio-frequency unit (signal generator) 22 designed to generate radio-frequency pulses or excitation pulses with predetermined temporal courses, amplitudes and spectral power distribution for exciting a magnetic resonance of the nuclear spins in the patient 100. Herein, pulse powers in the range of kilowatts can be used. The excitation pulses can be irradiated into the patient 100 via the body coil 14 or via one or more local transmitting antennas into the patient 100. The control unit 20 can also contain a controller 23 able to communicate with the gradient controller 21 and the radio-frequency unit 22 via a signal bus 25.

Optionally, a local coil 50 can be arranged in the immediate vicinity of the patient 100, for example on the patient 100 or in the patient couch 30, which coil 50 can be connected to the radio-frequency unit 22 via a connecting line 33. Depending upon the embodiment, the local coil 50 can be used as a main receiving antenna alternatively or additionally to the body coil 14.

The MRT system 1 also has at least one auxiliary receiving antenna 60 arranged outside the examination region, in particular outside the patient tunnel 16. In the example in FIG. 1, four auxiliary receiving antennas 60 are arranged, for example, at an edge of the opening of the patient tunnel 16; these can be arranged on the corners of a square encompassed by the circular opening so that the corners lie on the edge of the opening. However, other arrangements of the one or more auxiliary receiving antennas 60 are possible.

Figure 2:
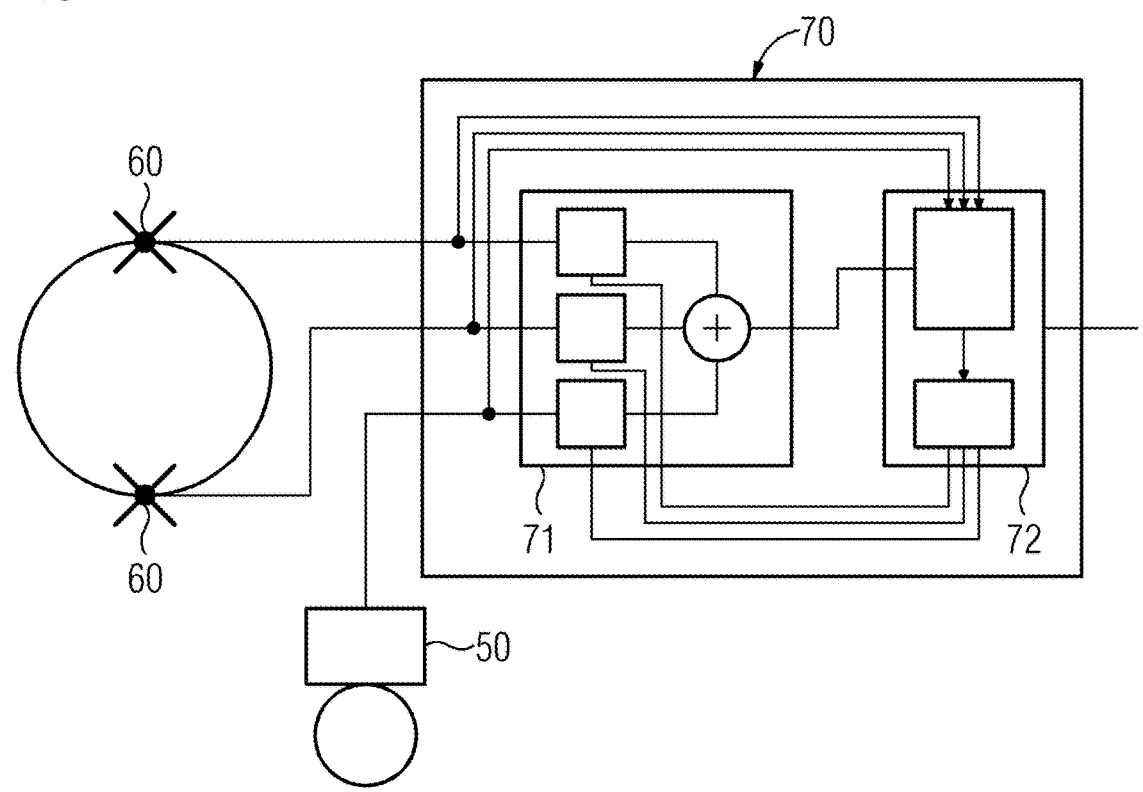
FIG. 2: a schematic representation of part of a further exemplary embodiment of an MRT system according to the improved concept.

The auxiliary receiving antennas 60 are in signal communication with a receiver 70 of the control unit 20, wherein the receiver 70 includes an interference suppression facility 72, as represented schematically in FIG. 2, for example.

The auxiliary receiving antennas 60 can in each case have omnidirectional reception characteristics but can also be at least partially designed as dipole antennas and complement each other by a different alignment to form omnidirectional characteristics. However, it is also conceivable for a single auxiliary receiving antenna 60 to be provided that, for example, has omnidirectional characteristics and, in particular can be embodied as a cross dipole.

Depending on the dimensions of the patient tunnel 16, due to the patient's finite conductivity, the patient 100 can act as the core of a coaxial conductor, the sheath of which is provided by a wall of the patient tunnel 16, and in this way forward an electromagnetic signal coupled into the patient 100 at the leg end or head end into the examination region. If the auxiliary receiving antennas 60 are, for example, arranged in the vicinity of the opening of the patient tunnel 16, this can compensate the influence of external interferers particularly effectively.

The MRT system also includes a computing unit 5 which is connected to the control unit 20, in particular to the radio-frequency unit 22 or the interference suppression facility 72.

FIG. 2 shows part of the MRT system 1 from FIG. 1, wherein in particular the receiver 70 is represented schematically.

The receiver 70 can, for example, have a summation facility (summer) 71 which can weight the signals incoming from the body coil 14 and/or the local coil 50 and from the auxiliary receiving antennas 60 with parameters, wherein the parameters can also be complex, in order to indicate a phase shift. In an analog receiver 70, this can take place by an adjustable amplifier in conjunction with an adjustable phase shifter, for instance. A real part of a parameter then corresponds to a gain factor and an imaginary part of the parameter corresponds to the phase shift. After weighting, the signals are summed accordingly. However, other, in particular non-linear, signal operations for combining the individual signals are also conceivable.

The interference suppression facility 72 receives the combined signal and, for example, also the individual signals from the local coil 50 and/or the body coil 14 or the auxiliary receiving antennas 60.

Figure 3:
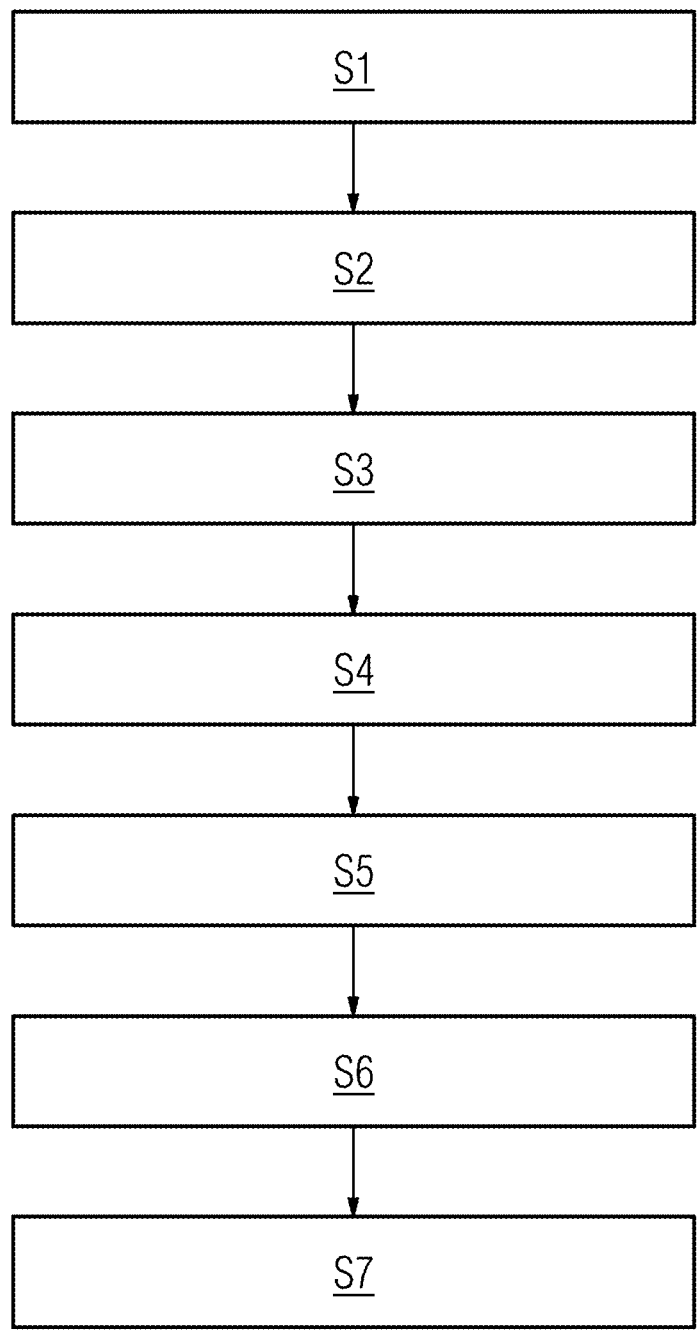
FIG. 3: a flowchart of an exemplary embodiment of a method according to the improved concept.

In an environment with a plurality of interferers, the MRT system 1 can determine the weighting factors of the individual auxiliary receiving antennas 60 for interference suppression. To explain this in more detail, the mode of operation of the MRT system 1 is explained in more detail with reference to FIG. 3 using an exemplary embodiment of a method according to the improved concept.

In act S1, the computing unit 5 carries out a simulation of a MR sequence in which part of the patient 100 is modeled as an ensemble of nuclear spins or protons. This can be based on a sequence commissioned by a user, including corresponding parametrization, i.e., for example, including a corresponding echo time TE and/or a corresponding repetition time TR. Furthermore, the spatial arrangements of the auxiliary receiving antennas 60 and the main receiving antenna 14, 50 are taken into account as well as their electromagnetic characteristics and the intended MR sequence. Based on such a model, the computing unit 5 can, for example, solve a corresponding Bloch equation for each proton and thus determine how the transverse magnetization of the nuclear spin ensemble proceeds qualitatively in space and time, in particular continuously, i.e., also outside the planned ADC measurement time windows, which are only relevant for imaging. Optionally, the simulation can also be used to simulate the MR signal actually expected.

For example, as part of the simulation, the computing unit 5 can determine time periods with high MR signal intensity, time periods with low MR signal intensity, time periods corresponding to readout phases of the pulse sequence and time periods outside the readout phases of the pulse sequence.

The simulation can, for example, be further refined by also taking account of information relating to the auxiliary receiving antennas 60 or the main receiving antenna 14, 50, such as, for example, sensitivity profiles relative to the MR signal source.

Furthermore, the simulation can be improved by using an adapted model for the signal source, i.e., the relevant region of the patient 100. For this purpose, it is possible, for example, to take account of the part of the patient 100 to be examined, the gender of the patient 100, the weight etc. This information can be fed into the simulations for solving the Bloch equations.

In act S2, the computing unit 5 determines one or more resting periods of the MR sequence in dependence on the results of the simulation, in particular in dependence on the temporal and spatial course of the transverse magnetization. Herein, the resting periods are determined in such a way that, during the resting periods, an absolute value of an expected MR signal amplitude according to the simulation is always less than or equal to a predetermined limit value.

After the determination of the resting periods, a MR recording of the patient 100 is carried out according to the previously simulated MR sequence. Herein, in act S3, during a first analysis period corresponding to one of the resting periods, an analysis signal is received by the main receiving antenna 14, 50 and by the auxiliary receiving antennas 60 in each case. The fact that the analysis signals are received during the resting period previously determined from the simulation means it can be assumed that the analysis signals are dominated by external interference and background noise.

Therefore, in act S4, the interference suppression facility 72 determines at least one interference suppression parameter based on the analysis signals determined during the analysis period. The at least one interference suppression parameter in particular includes the weighting factors that can be used by the summation facility 71 to generate the combined signal.

In act S5, the main receiving antenna 14, 50 receives an MR signal during the MR recording, but after the analysis period, and the auxiliary receiving antennas 60 in each case receive an interference signal.

In act S6, the interference suppression facility 72 generates the combined signal based on the MR signal, the interference signals and the interference-suppression parameters, in particular weighting factors, determined previously during act S4 in order to obtain an interference-suppressed MR signal. In act S7, the control unit 20 or the computing unit 5 can reconstruct a position space image based on the interference-suppressed MR signal.

Acts S3 to S6 can in particular be carried out repeatedly or iteratively during a measurement. The measurement is in particular occupied heterogeneously with analysis periods and MR experiments.

The interference source suppression described can also be performed with a single auxiliary receiving antenna 60. Conversely, it is possible for the receiver 70 to have a plurality of channels or for a plurality of receivers 70 to be provided in the MRT system 1 in order to suppress interference in MR signals from a plurality of main receiving antennas 14, 50. Herein, it is conceivable for the signals from the auxiliary receiving antennas 60 to be used by a plurality of receivers 70 or channels of the receiver or receivers 70 for interference suppression.

As described, in particular with respect to the figures, the improved concept thus indicates a possibility for interference reduction in the operation of an MRT system by which the requirements for shielding apparatuses can be reduced and which permits more reliable and more effective suppression of interfering influences.

MRT systems according to the improved concept can be used without shielding booths or with less complex shielding booths so that the costs of installation and, in particular, of relocating a device elsewhere can be considerably reduced, since the installation is much less dependent on the building in which it is installed.

In different embodiments, it is also possible to take account of spatially and/or temporally varying interference sources by adapting the interference suppression parameters several times during the MR recording, if necessary. The simulation of the MR sequence enables the optimal time periods for determining the interference suppression parameters for the specific MR sequence to be determined in an optimal manner.

This can provide a priori information as to what the ideal times or periods of time during the MR recording are for determining or updating the interference suppression parameters. During the resting periods determined by the simulation, the contribution from the actual MR signal is small, thus enabling improved correlation between the signals from the auxiliary receiving antennas and the main receiving antennas.

Optionally, it is also possible for a database of optimal time periods, in particular resting periods, to be created for different MR sequences, thus enabling the corresponding time periods to be determined more quickly.

For example, it is also possible for a limit value to be determined for the degree up to which the contribution from the simulated MR signal should be taken into account in order to enable the weighting factors to be determined correctly. The result determined can be a sampling pattern for updating the weighting factors. If, for example, it is found that insufficient update points are scheduled for the acquisition of dynamic interference sources, noise samples, in particular without the use of MR excitation pulses, can be inserted into the ongoing acquisition, for example between different slices, in order to increase the update rate.

Therefore, the improved concept uses a deterministic a priori determination of the resting periods during the MR scan in order to obtain optimal times for calculating the interference suppression parameters. Increasing the update rate enables better account to be taken of dynamic interference sources.

In different embodiments, it is also possible for the actual MR signal to be simulated based on block simulations and, in a sense, used as an additional signal source in addition to the auxiliary receiving antennas and the main receiving antenna.

It is intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

The invention claimed is:

1. A method for operating a magnetic resonance tomography system having a main receiving antenna and at least one auxiliary receiving antenna arranged outside an examination region, the method comprising:
   determining, by a computer, at least one simulation signal relating to a temporal and spatial course of a transverse magnetization of an ensemble of nuclear spins of an object with a simulation of a predetermined MR sequence for the object;
   determining a resting period of the MR sequence in dependence on the at least one simulation signal, wherein, during the resting period, an absolute value of an expected MR signal amplitude is always less than or equal to a predetermined limit value;
   carrying out an MR recording of the object by the magnetic resonance tomography system in accordance with the MR sequence, wherein, during an analysis period corresponding to the resting period, an analysis signal is received in each case by the main receiving antenna and the at least one auxiliary receiving antenna;
   determining at least one interference suppression parameter in dependence on the analysis signals;
   receiving an MR signal by the main receiving antenna during the MR recording, the MR signal received outside the analysis period;
   receiving an interference signal in each case by the at least one auxiliary receiving antenna; and
   generating an interference-suppressed MR signal based on the MR signal, the interference signals and the at least one interference suppression parameter.

2. The method as claimed in claim 1, characterized in that for each nuclear spin of the ensemble, a Bloch equation is numerically solved, at least approximately, to determine the at least one simulation signal.

3. The method as claimed in claim 1, characterized in that the simulation is carried out in dependence on at least one characteristic property of the main receiving antenna.

4. The method as claimed in claim 3, characterized in that the at least one characteristic property of the main receiving antenna includes a sensitivity profile of the main receiving antenna.

5. The method as claimed in claim 1, characterized in that the simulation is carried out in dependence on at least one characteristic property of the at least one auxiliary receiving antenna.

6. The method as claimed in claim 5, characterized in that the at least one characteristic property of the auxiliary receiving antenna includes a sensitivity profile of the at least one auxiliary receiving antenna.

7. The method as claimed in claim 1, characterized in that the at least one simulation signal includes a simulated MR signal; and the at least one interference suppression parameter is determined in dependence on the analysis signals and the simulated MR signal.

8. The method as claimed in claim 1, characterized in that a further resting period of the MR sequence occurring after the resting period is determined by the computer in dependence on the at least one simulation signal, wherein, during the further resting period of the absolute value, the expected MR signal amplitude is always less than or equal to the predetermined limit value; and during a further analysis period of the MR sequence corresponding to the further resting period, a further analysis signal is received in each case by the main receiving antenna and the at least one auxiliary receiving antenna;
- wherein the at least one interference suppression parameter is updated in dependence on the further analysis signals;
- wherein a further MR signal is received by the main receiving antenna during MR recording outside the analysis period and the further analysis period and a further interference signal is received in each case by the at least one auxiliary receiving antenna; and
- wherein a further MR signal that has been interference suppressed is generated based on the further MR signal, the further interference signals and the at least one updated interference suppression parameter.

9. The method as claimed in claim 1, characterized in that the MR signal and the interference signals are combined in dependence on the at least one interference suppression parameter to generate the interference-suppressed MR signal.

10. The method as claimed in claim 1, characterized in that the at least one interference suppression parameter includes a weighting factor for a function of the MR signal;
- wherein the at least one interference suppression parameter in each case includes a weighting factor for a function of the respective interference signal for each of the interference signals; and
- wherein the interference-suppressed MR signal is generated as the sum of the function of the MR signal and the respective functions of the interference signals weighted based on the weighting factors.

11. The method as claimed in claim 10, characterized in that an optimization method is carried out in which the weighting factors are varied to determine the at least one interference suppression parameter.

12. The method as claimed in claim 1, characterized in that the at least one interference suppression parameter in each case includes a weighting factor for the MR signal and each of the interference signals; and
- wherein the interference-suppressed MR signal is generated as the sum of the MR signal and the interference signals weighted based on the weighting factors.

13. The method as claimed in claim 12, characterized in that an optimization method is carried out in which the weighting factors are varied to determine the at least one interference suppression parameter.

14. The method as claimed in claim 1, further comprising generating a position space image in dependence on the interference-suppressed MR-signal.

15. A magnetic resonance tomography system comprising:
- a main receiving antenna;
- at least one auxiliary receiving antenna arranged outside an examination region;
- a controller; and
- a computer configured to carry out a simulation of a predetermined MR sequence of an object to determine at least one simulation signal relating to a temporal and spatial course of the transverse magnetization of an ensemble of nuclear spins of the object and to determine a resting period of the MR sequence in dependence on the at least one simulation signal, wherein, during the resting period, an absolute value of an expected MR signal amplitude is always less than or equal to a predetermined limit value;
- wherein the controller is configured to actuate the magnetic resonance tomography system to carry out an MR recording of the object in accordance with the MR sequence, wherein, during an analysis period corresponding to the resting period, in each case an analysis signal is received by the main receiving antenna and the at least one auxiliary receiving antenna, to determine at least one interference suppression parameter in dependence on the analysis signals, and to generate an interference-suppressed MR signal based on an MR signal and interference signals and the at least one interference suppression parameter, wherein, during MR recording outside the analysis period, the MR signal is received by the main receiving antenna and one of the interference signals is in each case received by the at least one auxiliary receiving antenna.

16. A non-transitory computer readable storage medium having stored thereon instruction executable by a processor, the instructions comprising:
- determining, by a computer, at least one simulation signal relating to a temporal and spatial course of a transverse magnetization of an ensemble of nuclear spins of an object with a simulation of a predetermined MR sequence for the object;
- determining a resting period of the MR sequence in dependence on the at least one simulation signal, wherein, during the resting period, an absolute value of an expected MR signal amplitude is always less than or equal to a predetermined limit value;
- carrying out an MR recording of the object by the magnetic resonance tomography system in accordance with the MR sequence, wherein, during an analysis period corresponding to the resting period, an analysis signal is received in each case by a main receiving antenna and at least one auxiliary receiving antenna;
- determining at least one interference suppression parameter in dependence on the analysis signals;
- receiving an MR signal by the main receiving antenna during the MR recording, the MR signal received outside the analysis period;
- receiving an interference signal in each case by the at least one auxiliary receiving antenna; and
- generating an interference-suppressed MR signal based on the MR signal, the interference signals and the at least one interference suppression parameter.

17. The non-transitory computer readable storage medium of claim 16, wherein the instructions comprise carrying out the simulation in dependence on at least one characteristic property of the main receiving antenna.

18. The non-transitory computer readable storage medium of claim 16, wherein the instructions comprise carrying out the simulation in dependence on at least one characteristic property of the at least one auxiliary receiving antenna.

19. The non-transitory computer readable storage medium of claim 16, wherein the at least one interference suppression parameter includes a weighting factor for a function of the MR signal;
   wherein the at least one interference suppression parameter in each case includes a weighting factor for a function of the respective interference signal for each of the interference signals; and
   wherein the interference-suppressed MR signal is generated as the sum of the function of the MR signal and the respective functions of the interference signals weighted based on the weighting factors.

20. The non-transitory computer readable storage medium of claim 16, wherein the at least one interference suppression parameter in each case includes a weighting factor for the MR signal and each of the interference signals; and
   wherein the interference-suppressed MR signal is generated as the sum of the MR signal and the interference signals weighted based on the weighting factors.

* * * * *